(12) United States Patent
Budiman et al.

(10) Patent No.: US 9,898,000 B2
(45) Date of Patent: Feb. 20, 2018

(54) PLANAR POSITIONING SYSTEM AND METHOD OF USING THE SAME

(71) Applicant: Akribis Systems Pte Ltd, Singapore (SG)

(72) Inventors: Sastra Budiman, Singapore (SG); Yong Peng Leow, Singapore (SG); Mun Hoon Ng, Singapore (SG)

(73) Assignee: AKRIBIS SYSTEMS PTE LTD, Singapore (SG)

( * ) Notice: Subject to any disclaimer, the term of this patent is extended or adjusted under 35 U.S.C. 154(b) by 645 days.

(21) Appl. No.: 14/400,796

(22) PCT Filed: Jan. 30, 2013

(86) PCT No.: PCT/SG2013/000039
§ 371 (c)(1),
(2) Date: Nov. 13, 2014

(87) PCT Pub. No.: WO2014/120082
PCT Pub. Date: Aug. 7, 2014

(65) Prior Publication Data
US 2015/0127133 A1    May 7, 2015

(51) Int. Cl.
*G06F 19/00* (2011.01)
*G05B 19/418* (2006.01)
*H01L 21/68* (2006.01)
*G03F 7/20* (2006.01)

(52) U.S. Cl.
CPC ....... *G05B 19/418* (2013.01); *G03F 7/70758* (2013.01); *H01L 21/68* (2013.01); *G05B 2219/45031* (2013.01); *G05B 2219/45032* (2013.01); *G05B 2219/49276* (2013.01)

(58) Field of Classification Search
None
See application file for complete search history.

(56) References Cited

U.S. PATENT DOCUMENTS

| | | | |
|---|---|---|---|
| 5,844,664 A * | 12/1998 | Van Kimmenade | G03F 7/707 355/53 |
| 5,850,342 A * | 12/1998 | Nakamura | B23Q 7/00 198/468.2 |
| 6,083,082 A * | 7/2000 | Saldana | B24B 37/005 451/11 |

(Continued)

OTHER PUBLICATIONS

Aguirre, Gorka et al. "A multiphysics model for optimizing the design of active aerostatic thrust bearings". Precision Engineering 34 (2010) 507-515.*

(Continued)

*Primary Examiner* — Adam Lee
(74) *Attorney, Agent, or Firm* — Leong C. Lei

(57) ABSTRACT

A positioning system having a flat base comprising (i) a X-axis assembly having a X-axis linear actuator means arranged orthogonal to the Y-axis; (ii) a Y-axis assembly having a pair of Y-axis linear actuator means mounted onto the flat base forming a H-configuration; (iii) a Z-axis assembly having an aerostatic bearing mechanism that floats on thin film of externally pressurized air on top of the flat base; and a θ-axis actuator anchored from the X-axis to drive the Z-axis assembly which carries a workpiece, wherein the Z-axis assembly is rotated with the rotary axis for the θ-axis perpendicular to the flat base.

24 Claims, 5 Drawing Sheets

(56) References Cited

U.S. PATENT DOCUMENTS

| | | | |
|---|---|---|---|
| 2003/0156270 A1* | 8/2003 | Hunter | G03F 7/707 355/72 |
| 2010/0050832 A1* | 3/2010 | Kim | B23Q 1/015 82/118 |
| 2010/0228388 A1* | 9/2010 | Ago | B65G 47/917 700/228 |
| 2011/0142534 A1* | 6/2011 | Brogardh | F16C 11/0647 403/141 |
| 2011/0277603 A1* | 11/2011 | Uchimura | B23B 5/08 82/159 |
| 2012/0296469 A1* | 11/2012 | Yoshinaga | B25J 15/0616 700/218 |

OTHER PUBLICATIONS

Oiwa, Takaaki et al. "Linear rectangular air bearing based on squeeze film generated by ultrasonic oscillation". Review of Scientific Instruments 76, 075101 (2005).*

Takeuchi, Y. et al. "Development of a 5-Axis Control Ultraprecision Millin Machine for Micromachining Based on Non-Friction Servomechanisms". Basic Research Laboratory, Fanuc Ltd. Toyota Technological Institute, Jan. 4, 2000.*

* cited by examiner

PLANAR POSITIONING SYSTEM AND METHOD OF USING THE SAME

FIELD OF THE INVENTION

The present invention relates to electromechanical positioning system for precision motion control. More specifically, the present invention relates to precise positioning of integrated circuit wafers, photonic components and the like, and the method of using the system.

BACKGROUND OF THE INVENTION

A conventional XYZθ positioning system is formed by stacking Y-axis assembly onto X-axis assembly, forming two orthogonal axes. Next, the additional Z-axis is stacked onto the X-axis assembly vertically, and then lastly, the θ-axis is mounted on top of the Z-axis. One limitation of such stacking system of the conventional XYZθ positioning system is that the positional accuracy is adversely affected by errors in each axis. The positional errors of the entire system will be the results of all the errors of the different axes coupled together.

A further drawback of such stacking approach in this conventional XYZθ positioning system is that adjustment made to any axis will affect the positioning of other axes that are on top of the particular axis. This means that the alignment of the whole system of the conventional XYZθ positioning system is dependent of the alignment of each axis.

The third disadvantage of the conventional stacked system is the high and large footprint required to stack all the axes. This large footprint makes the design of the system to be spatially not efficient, and even not feasible in most of the machine designs in which spatial constraint is critical. A larger footprint of the XYZθ positioning system in turn affects the footprint of the design of the whole system. For example, U.S. Pat. No. 4,492,356 reveals a design of X-Y table utilizing the stacked-up approach. This design has the Y-axis table being stacked onto the X-axis table, resulting in relatively high footprint of the X-Y table.

Another similar stacking approach positioning system is disclosed in U.S. Pat. No. 6,588,081, in which the θ-axis is stacked on top of the Z-axis. U.S. Pat. No. 6,588,081 also discloses the design of the X-Y stacked table, and a rotary table, θ-axis, is mounted onto the X-Y table. This design also allows for modular X-Y table to be stacked higher up onto the rotary table, forming an even higher footprint system. These stacking systems attribute to the poor footprint efficiency.

With the many limitations in such system, some prior art systems attempt to solve the issues occurred in the stacking system. U.S. Pat. No. 5,040,431 utilizes X-Y stages using air bearing elements and a flat surface plate to decouple the vibration and rolling of the Y stage from the X stage.

Another similar design is revealed in the U.S. Pat. No. 5,228,358, in which the X-Y stage is driven by a linear motor using permanent magnet. The construction of the guidance for these systems is using the air bearings. The number of air bearings used is approximately 14, for guiding the X and Y axis. Such a large number of air bearing units makes the design to be economically inefficient and the air consumption rate is very high.

One approach in resolving the large footprint issue is addressed in U.S. Pat. No. 7,271,879, which uses a decoupled X-Y stage design to obtain a low vertical profile and a moderate footprint size. In U.S. Pat. No. 7,271,879, a moving platform holding the workpiece is floating on the two rigid reference surfaces mounted onto a rigid base. One limitation of such a design is that the calibration and machining efforts are needed for the alignment of the two reference surfaces for parallelism.

U.S. Pat. No. 5,731,641 is a design in providing a lift stage based on wedge design, providing performance in improved acceleration, speed and system bandwidth. However, in terms of the spatial requirement to achieve this lift or Z-axis direction movement, this wedge design is not efficient. The stroke of the lift is a fraction of the horizontal stroke the lift moves, hence accounting for the large footprint in X and Y direction.

U.S. Pat. No. 8,008,815 a discloses a planar stage moving apparatus for a machine comprising: first to fourth linear motors for applying, between a base and a table, a movement force to the table, each linear motor including a stator core on which a coil is wound and which is fixed to the base and a mover core to which permanent magnets are attached and which is fixed to the table; an air bearing unit to provide a repulsive force between the base and the table, to separate the base and the table and thereby permit to move under the influence of magnet fields when currents are applied to the coils of the linear motors, wherein the air bearing unit comprises a plurality of air bearing pads for each of said linear motors, wherein the air bearing pads are provided between the permanent magnets of each of said linear motors; and a linear encoder installed on one side of the table to measure movement of the table, the first and third linear motors being provided between the base and the table on the lower and upper sides of the table respectively to move the table in the X-axis directional movement of the table, the second and fourth linear motors being provided between the base and the table on the right and left sides of the table respectively to move the table in the Y-axis directional movement of the table, the air pads being fixed to a plurality of grooves formed on the lower surface of the table respectively and a plurality of air supply lines formed at intermediate portions of the table to provide a pneumatic pressure to the grooves respectively.

U.S. Pat. No. 7,271,879 relates to planar positioning system, comprising: a rigid base; first and second actuator means each having a fixed portion directly anchored to said rigid base, the first and second actuator means each having a respective moveable portion that is linearly moveable relative to the rigid base, wherein the first and second actuator moveable portions are restricted to movement in respective first and second orthogonal linear dimensions; a flat reference surface mounted to said base; a moveable platform for holding a workpiece, the moveable platform being supported for planar movement over said reference surface; a first coupling between the first actuator moveable portion and the moveable platform for effecting movement of the platform in the first linear dimension, the first coupling also serving to guide the platform in the second linear dimension; and a second coupling between the second actuator moveable portion and the moveable platform for effecting movement of the platform in the second linear dimension, the second coupling also serving to guide the platform in the first linear dimension.

U.S. Pat. No. 7,257,902 discloses a stage device comprising: a base; a stage carrying a movable body and being moved over the base; a planar motor driving the stage; an air bearing acting to lift the stage over the base; a scale part disposed on the base to include an angle grating which has an angle-related characteristic varied in a two-dimensional direction in accordance with a known function; and at least one two-dimensional angle sensor disposed on the stage so that the at least one two-dimensional angle sensor emits a light beam to the angle grating of the scale part and detects a two-dimensional angle of a light beam reflected from the scale part.

SUMMARY OF THE INVENTION

It is an object of the present invention to provide a decoupled XYZθ positioning apparatus having a rigid flat base comprising (i) a pair of Y-axis linear actuator means mounted onto the rigid flat base to form a H-configuration structure; (ii) a Y-axis linear actuator means arranged orthogonal to the Y-axis; (iii) an θ-axis actuator mounted rigidly to the X-axis giving a rotation torque through a flexible power transmission element to the Z-axis, and wherein the Z-axis is provided with an aerostatic bearing mechanism that floats on thin film of externally pressurized air on top of the rigid flat base.

It is yet another object of the present invention to provide a decoupled XYZθ positioning apparatus, wherein the Z-axis movement comprises a coarse movement and a fine movement defines the lift function, and the coarse movement has two defined Z-positions, and the fine movement has the fine resolution which accounts for the high precision positioning of the Z-position of a workpiece.

Yet another object of the present invention is to provide a decoupled XYZθ positioning apparatus, wherein the Y-axis linear actuator means comprises two linear actuators arranged in parallel to each other, and the X-axis linear actuator is placed in between these two Y-axis linear actuators such that the distance between the Y-axis linear actuators is more than the range of motion of the X-axis linear actuator means.

A further object of the present invention is to provide a decoupled XYZθ positioning apparatus, wherein the X-axis linear actuator means is placed in the middle of the Y-axis linear actuator means.

Another object of the present invention is to provide a decoupled XYZθ positioning apparatus, further comprises an elastic linkage element to couple the X-axis to the Z-axis and θ-axis, wherein the elastic linkage element has the features of elastically uncouple the flatness, roll, and pitch errors of the whole Z-axis assembly from the X-axis and Y-axis of the apparatus.

Yet a further object of the present invention is to provide a decoupled XYZθ positioning apparatus, wherein the flatness, roll, and pitch errors are derived from the rigid flat base which is typically very minimal, and results in the workpiece to have high positional accuracy in these parameters.

Still another object of the present invention is to provide a decoupled XYZθ positioning apparatus, further comprises a positional sensing means for closed loop feedback control for all the X-axis, Y-axis, Z-axis and θ-axis, wherein the positional sensing means include linear optical encoder.

A further object of the present invention is to provide a decoupled XYZθ positioning apparatus, wherein each measurement system of the apparatus consists an optical readhead, an optical linear scale and an index sensor to mark a zero position of range of motion. Preferably, the optical linear scale is mounted rigidly onto a base where there is negligible temperature change, and the read-head is preferred to be anchored onto the moving components, for instance, the moving carriage plate, of the applicable axis.

In accordance with the present invention, the decoupled positioning apparatus utilizes creative means to achieve high speed, high precision positioning with low profile and moderate footprint. The decoupling of the Z-axis from the rest of the other axes means that the Y-axis and X-axis are not carrying the weight of Z-axis, hence higher speed can be attained. Further decoupling the Z-axis ensures the errors and dynamics of the X-axis and the Y-axis do not propagate to the Z-axis, hence resulting in a more precise positioning of the system.

The other objectives, advantages and features of the present invention will become more apparent from the following descriptions of the preferred embodiments with the aid of the accompany drawings.

BRIEF DESCRIPTION OF THE DRAWINGS

A preferred embodiment of the invention is described in detail hereinbelow, by way of example only, and with reference to the accompanying drawings, in which.

DETAILED DESCRIPTION OF THE INVENTION

Figure 1:
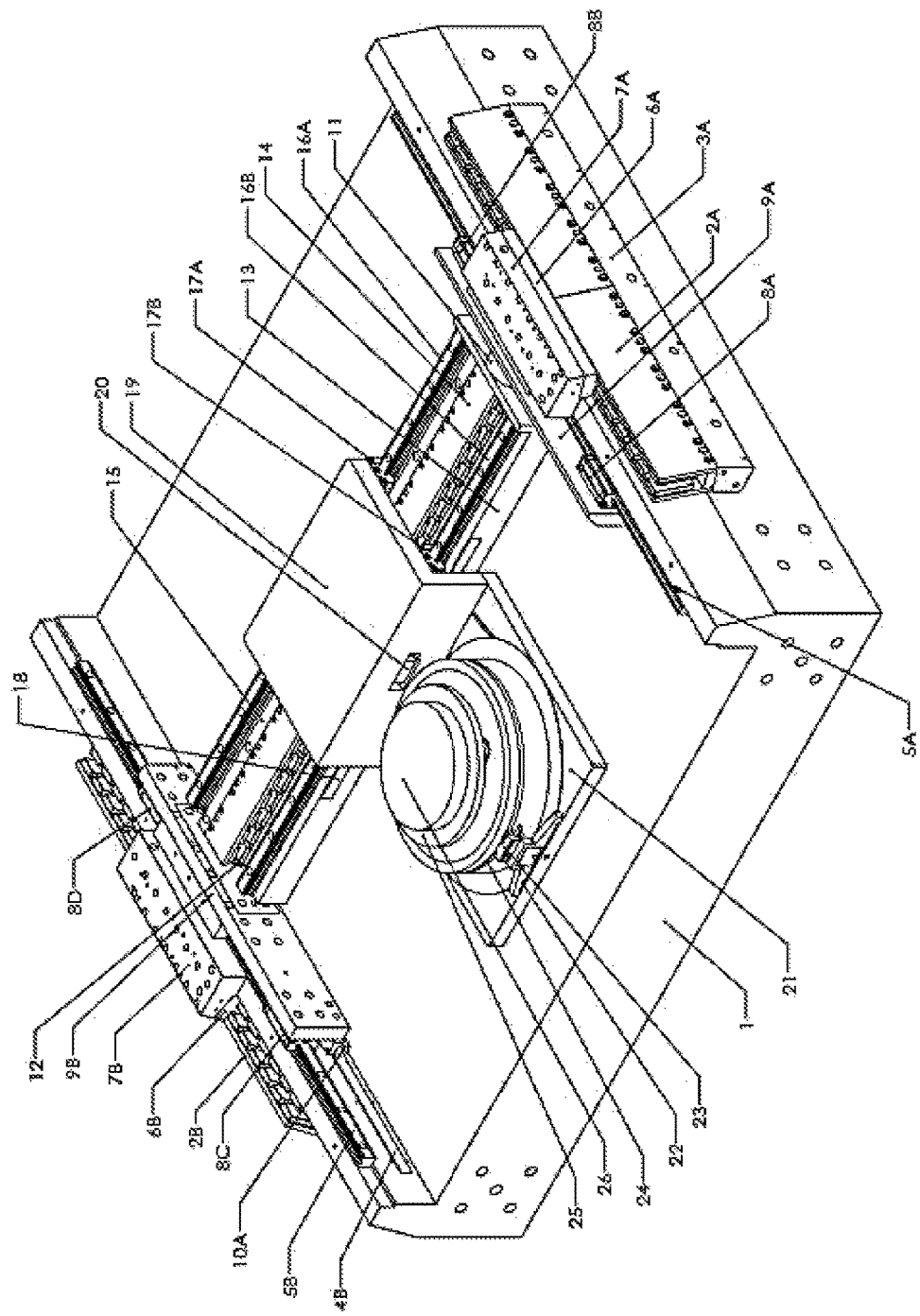
FIG. 1. is a perspective view of XYZθ positioning system according to a preferred embodiment of the present invention, showing the basic layout of the four axes and the granite platform.
Figure 2:
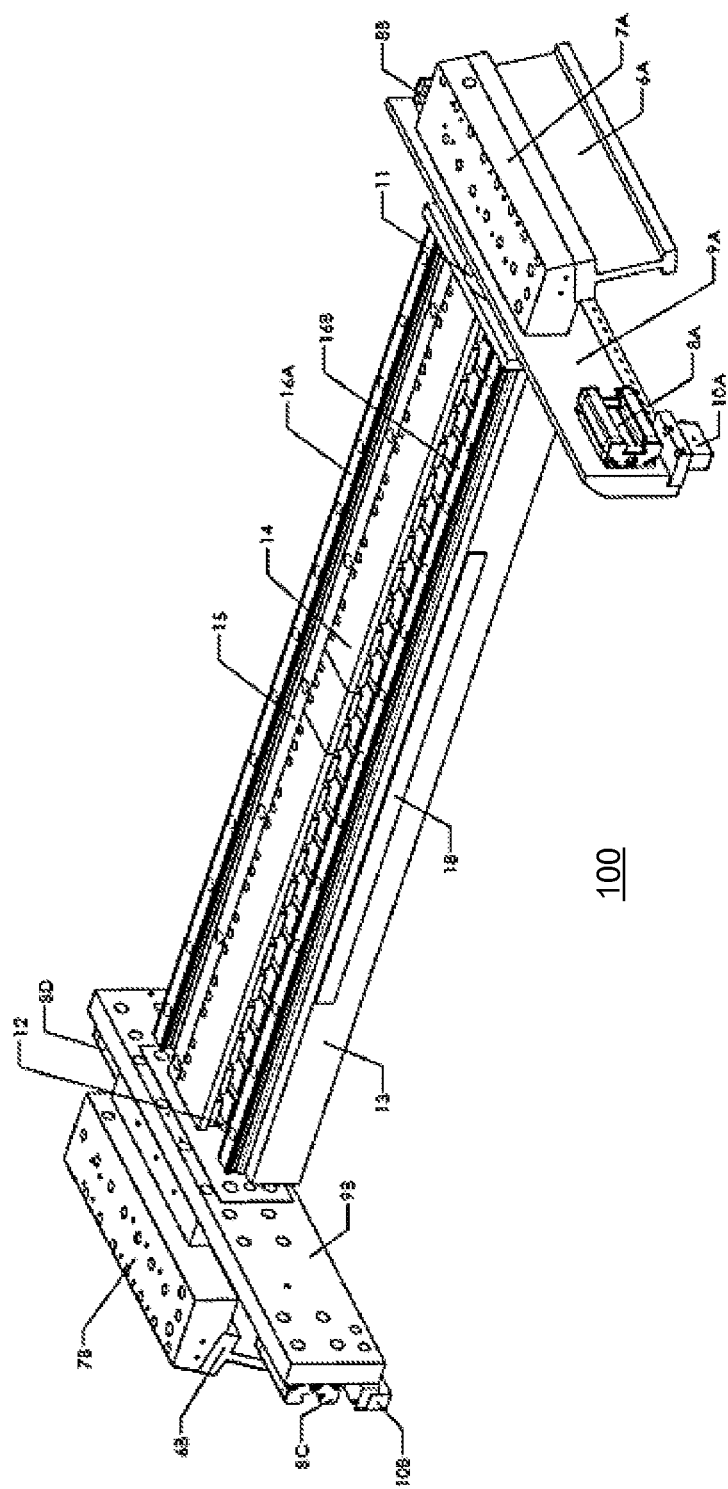
FIG. 2. is a perspective view showing the Y-axis component layout of the system of FIG. 1 of the present invention.
Figure 4:
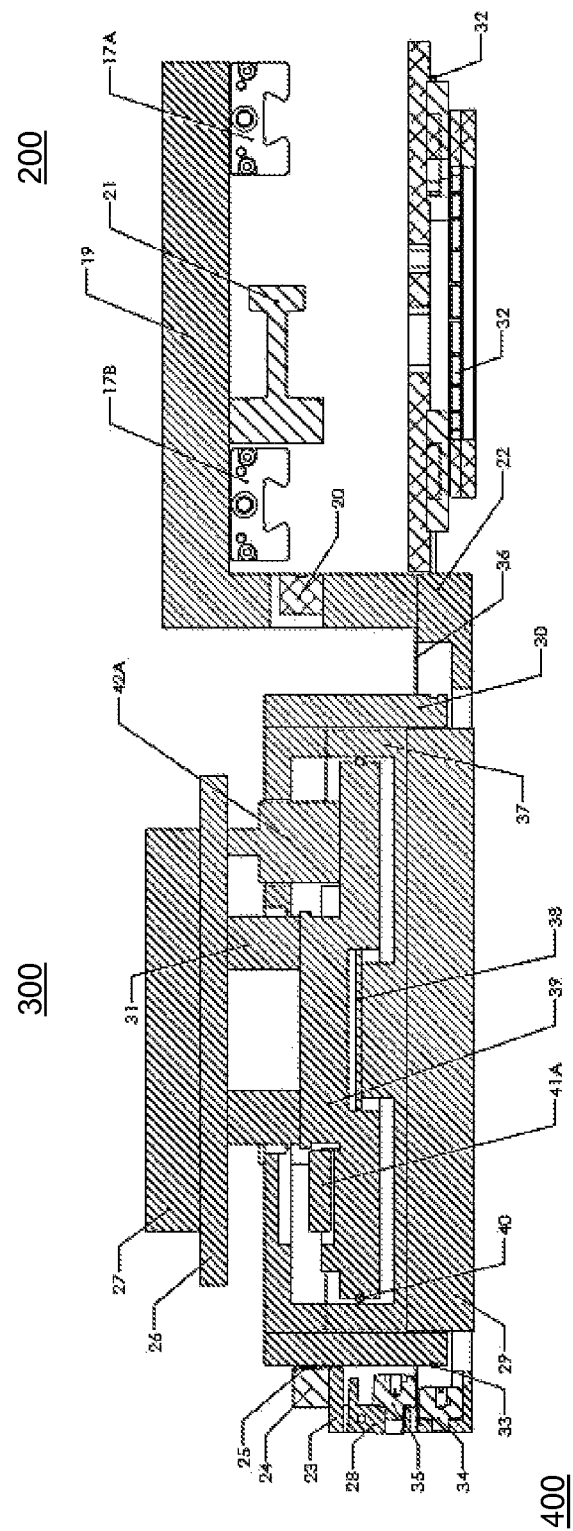
FIG. 4. is a cross sectional view showing the details of the X-axis, Z-axis and the θ-axis in accordance with the present invention.
Figure 5:
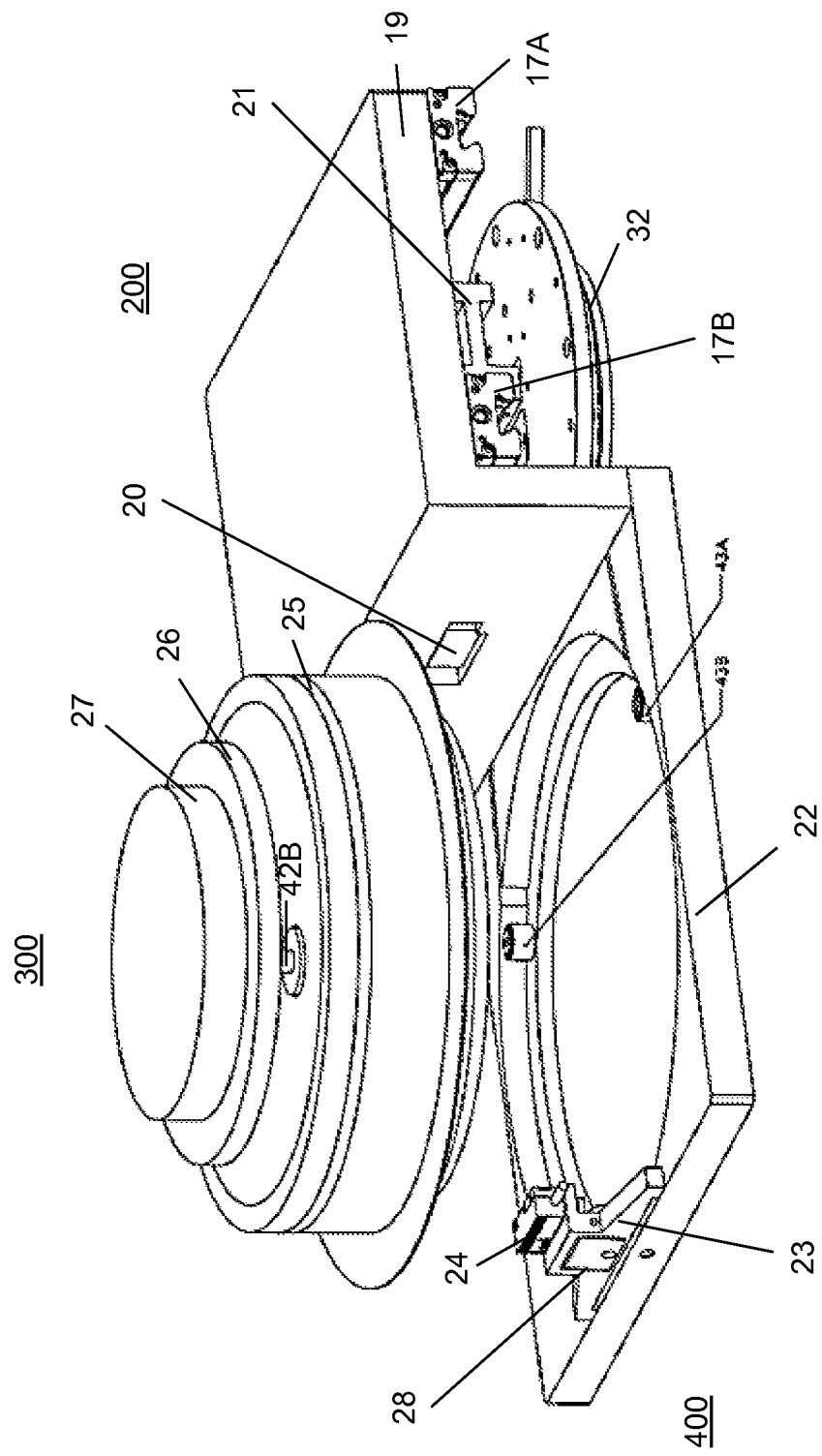
FIG. 5. is a perspective view showing the Z-axis and the θ-axis lifted out of the X-axis of the present invention.

A decoupled XYZθ positioning apparatus is illustrated in the drawings, constructed according to a preferred embodiment of the present invention. The overall structure of the positioning apparatus which is illustrated in FIG. 1 comprises a Y-axis assembly (100) which is shown in FIG. 2, a X-axis assembly (200), a Z-axis assembly (300) and a θ-axis assembly (400) shown in FIG. 3. The cross sectional view of the combination of the X-axis, Z-axis and θ-axis assembly (200, 300, 400) is also shown in FIG. 4. FIG. 5 shows the Z-axis (300) and the θ-axis (400) lifted up from the X-axis (200) in accordance with the present invention.

In accordance with a preferred embodiment of the present invention, the positioning apparatus as shown in FIG. 1 comprises a very flat table top (1) which is made from a flat material, preferably granite or the like. It is to be realized that the important of the table top is that the material thereof has to be flat and stiff and with low coefficient of thermal expansion, and it is not to limit the material to granite in the present invention. This granite table top (1) provides a very flat and level reference plane for the slider assembly (300) shown in FIG. 3 to glide thereon. This will ensure that the apparatus will follow the X-axis and Y-axis flatness accuracy from this very flat granite plane through decoupling of the flatness error of the Y-axis guiding rail (5A) and (5B), and the X-axis guiding rail (16A) and (16B). This granite top (1) is also provided with two straight and parallel surfaces for mounting the Y-axis guiding rail (5A) and (5B). This will ensure the Y-axis straightness accuracy of the positioning system of the present invention.

The Y-axis assembly (100) as seen in FIGS. 1 and 2 comprises Y-axis actuator track (2A) and (2B), Y-axis actuator track bracket (3A) and (3B), Y-axis measuring scale (4A)

(not shown) and (4B), Y-axis guiding rail (5A) and (5B), Y-axis actuator coil (6A) and (6B), Y-axis actuator coil bracket (7A) and (7B), Y-axis guiding blocks (8A, 8B, 8C and 8D), Y-axis carriage (9A) and (9B), Y-axis position sensors (10A and 10B), Joints (11 and 12), and Y-axis push bar (13).

In the present invention, the Y-axis actuator track (2A and 2B), with the Y-axis actuator coil (6A and 6B) are linear actuators that are positioned parallel to one another adjacent sides of the granite top (1). The Y-axis actuator tracks (2A and 2B) are mounted onto the Y-axis actuator track brackets (3A and 3B), which in turn are mounted onto the granite top (1). The Y-axis actuator coils (6A and 6B) are mounted onto the Y-axis actuator coil brackets (7A and 7B), which then are mounted onto the Y-axis carriages (9A and 9B). This Y-axis actuation from the Y-axis carriages (9A and 9B) connected by joints (11 and 12) pushes the Y-axis push bar (13). The Y-axis motion is guided by the Y-axis guiding blocks (8A, 8B, 8C and 8D) running on the Y-axis guiding rails (5A and 5B). The Y-axis guiding blocks (8A, 8B, 8C and 8D) is an aerostatic bearing system for high speed applications, a hydrostatic bearing system for heavy duty applications and a rolling bearing system for operating in vacuum environment.

The position of the Y-axis is determined by the Y-axis position sensors (10A and 10B) with respect to the Y-axis measuring scales (4A and 4B). The Y-axis measuring scales (4A and 4B) are symmetrically positioned on the two sides of the granite top (1). The positional information generated by the position sensors (10A and 10B) is useful as a feedback signal for controlling circuitry that drives the actuators, so that precise positioning can be achieved.

The connection of the two Y-axis actuator coils (6A and 6B) to the Y-axis push bar (13) is via the usage of two joints (11 and 12). The joint (11) is a ball and socket joint that determines the three degree of freedoms namely, the X, Y and Z position of the Y axis assembly (FIG. 2). The joint (12) on the far side of the Y-axis push bar (13) is an elastic linkage that will determine three degree of freedoms, which are the Y, Z and θ position of the Y-axis assembly. In this way, the Y-axis push bar (13) is statically determinate with six degree of freedoms fixed. The advantage of this connecting mechanism is that the Y-axis push bar (13) has compliance in the X direction, which is the lengthwise direction of the Y-axis push bar (13). This coupling mechanism ensures that the system Y-axis movement will not be affected by the parallelism error of the two Y-axis guiding rails (5A and 5B).

Figure 3:
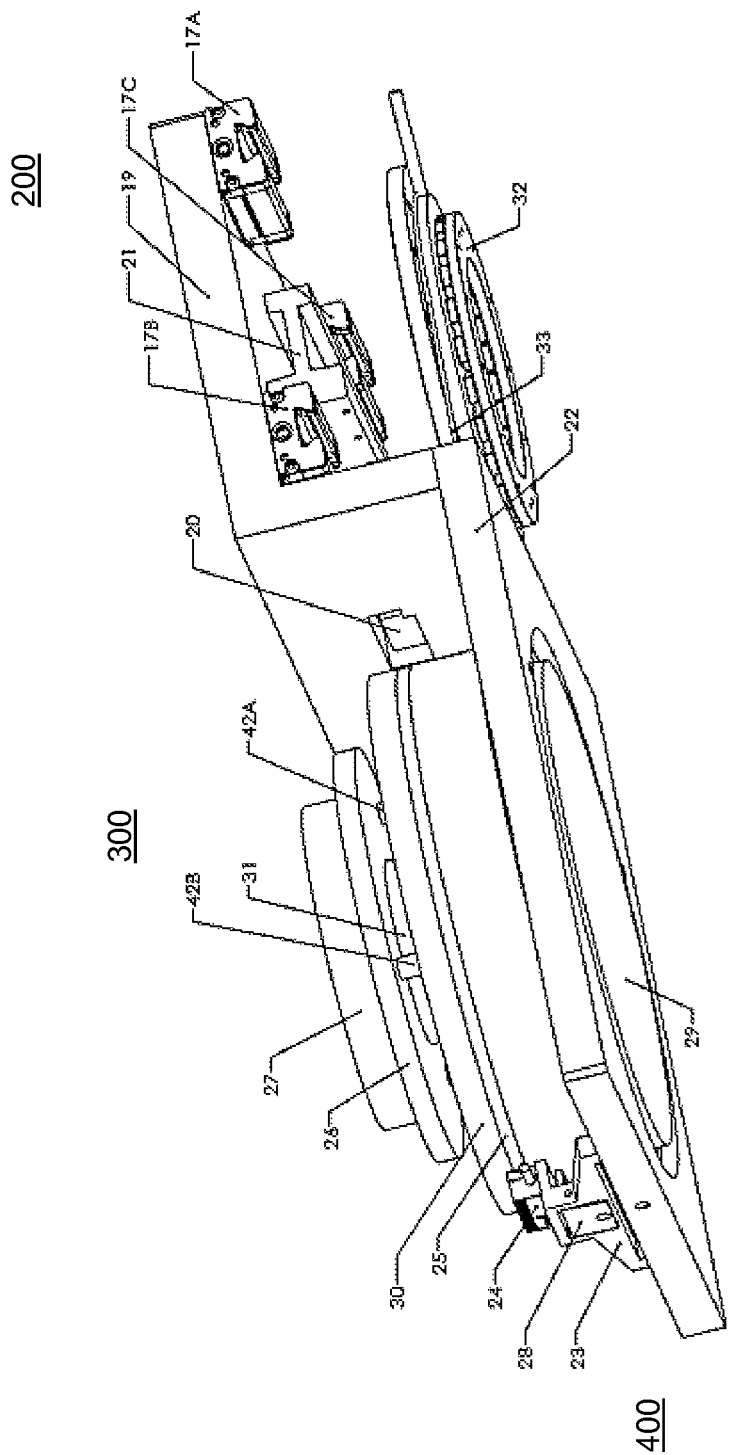
FIG. 3. is a perspective view showing the X-axis, Z-axis and the θ-axis component layout of the system of FIG. 1 of the present invention.

The X-axis assembly (200) as seen in FIGS. 2 and 3 comprises a X-axis actuator track (14), a X-axis actuator track bracket (15), X-axis guiding rails (16A and 16B), a X-axis measuring scale (18), X-axis guiding blocks (17A, 17B, 17C and 17D), a X-axis carriage (19), a X-axis position sensor (20), a X-axis actuator coil (21), and a X-axis pusher plate (22).

The X-axis actuator track (14), with the X-axis actuator coil (21) are linear actuators that drive the X-axis carriage (19), with the motion guided by the X-axis guiding blocks (17A, 17B, 17C and 17D) running on the X-axis guiding rails (16A and 16B). The X-axis guiding elements (16A-16B, 17A-17D) can be an aerostatic bearing system for high speed applications, a hydrostatic bearing system for heavy duty applications and a rolling bearing system.

The position of the X-axis is determined by the X-axis position sensor (20) with respect to the X-axis measuring scale (18). The X-axis measuring scale (18) is mounted through the centerline of the workpiece (27) to reduce the potential for occurrence of Abbe errors. Abbe errors are the errors resulted from an offset between the plane of the measurement axis and the axis of motion of the part.

The X-axis pusher plate (22) is mounted rigidly onto the X-axis carriage (19). This pusher plate (22) drives the whole Z-axis and the θ-axis in the X and Y directions.

The θ-axis assembly (400) as seen in FIGS. 3, 4, and 5 comprises a θ-axis position sensor bracket (23), a θ-axis position sensor (24), a θ-axis measuring scale (25), a θ-axis guiding roller bracket (28), a slider decoupler (30), a θ-axis actuator (32), a flexible power transmission element (33), a fixed roller mechanism (34), a preloaded roller mechanism (35), Roller mechanism, preloaded 35, a membrane 36, θ-axis guiding elements (43A and 43B). The θ-axis actuator 32 drives the slider decoupler (30) via the flexible power transmission element (33) in terms of the rotational direction. The θ-axis actuator (32) is preferably a direct drive rotary motor with iron core type of brushless motor for high torque applications, or coreless type of brushless motor for applications that cannot tolerate cogging torque. The flexible power transmission element 33 may be a belt for high speed low torque applications or a chain for low speed high torque applications, for this power transmission from the θ-axis actuator (32). The rotary motion is guided by the θ-axis guiding elements (43A and 43B) in the radial direction, which will determine the θ-axis positional accuracy. The θ-axis guiding elements (43A and 43B) may be high precision roller bearings for applications that require high rotary accuracy. The fixed roller mechanism (34), and the preloaded Roller mechanism (35), which are mounted onto the θ-axis guiding roller bracket (28) are the elements that will ensure the rotating Z-axis to have high resistance to pitching moment. The membrane (36) is mounted rigidly to the slider decoupler (30), which in turn is anchored to the whole Z-axis. The membrane (36) will be rotating driven by the flexible power transmission element (33). The fixed roller mechanism (34) will glide on the underside of the membrane (36), and this will ensure the rotation is guided accurately in axial direction. The preloaded roller mechanism (35) is placed above the membrane (36), and is preloaded by the spring element to press against the top side of the membrane (36), so that the motion will be constrained axially.

The position of the θ-axis is determined by the θ-axis position sensor (24) with respect to the θ-axis measuring scale (25). The θ-axis position sensor (24) is mounted rigidly onto the θ-axis position sensor bracket (23), which sits onto the X-axis pusher plate (22). The positional information generated by the position sensors (24) will be used as feedback signal for controlling circuitry that drives the θ actuator, hence the precise positioning of the θ-axis can be achieved.

Referring to FIGS. 3, 4 and 5, there is shown the Z-axis assembly (300) which comprises a workpiece holder (26), a workpiece (27), an aerostatic bearing mechanism (29), a piston decoupler (31), a slider body (37), a slider guiding element (38), a Z-axis piston (39), a Z-axis sealing element (40), a Z-axis locking mechanism (41A, 41B, and 41C), Z-axis fine positioning actuators (42A, 42B, and 42C). The aerostatic bearing mechanism (29) is an air bearing that utilizes a thin film of externally pressurized air to provide frictionless load-bearing interface between the surfaces of the aerostatic bearing mechanism (29) and the granite table top (1), allowing the high precision of the flatness of the X and Y positioning. The aerostatic bearing mechanism (29) is air bearings that channel pressurized air through an orifice or a porous material. The methods of mounting the workpiece (27) onto the workpiece holder (26) can be via suction or via mounting screws and bolts. The preferred method is the former, in which the workpiece holder (26) contains orifices that can channel the vacuum to the contact surface of the the workpiece (27). This yields the advantage of maintaining the flatness of the workpiece (27) by not easily distorting the profile due to the clamping stresses induced by the mounting screws and bolts.

The Z-axis movement is segregated into two components: the coarse movement and the fine movement. The coarse movement typically covers the clearance distance for loading and unloading phase for the workpiece (27), and can be up to 20 millimeters of distance. The fine movement typically is for the final precise positioning of the workpiece 27, and normally covers less than one millimeter in distance. For the coarse movement, the components involved are the slider body (37), the slider guiding element (38), the Z-axis piston (39), the Z-axis sealing element (40), the Z-axis locking mechanism (41A, 41B and 41C). The working principle of this coarse Z-axis is similar to that of a pneumatic cylinder, where one of ordinary skill in the art will readily recognize the technology. The slider body (37) acts as a closed vessel for the externally pressurized air to push the Z-axis piston (39) up to the end position which is defined by the Z-axis locking mechanism (41A, 41B, and 41C). The motion of the upward movement is guided by the slider guiding element (38). However, at the topmost position, the guidance from the slider guiding element (38) will be disengaged, leaving the exact determinate Z-position to be defined by the Z-axis locking mechanism (41A, 41B, and 41C). The Z-axis sealing element (40) is mounted onto the circumference of the Z-axis piston (39) to provide the sealing of the externally pressurized air within the whole vessel of the slider body (37). The Z-axis sealing element (40) is an O-ring used in pneumatic system. The Z-axis locking mechanisms (41A, 41B, and 41C) are kinematic couplings that allow zero degree of freedom of the Z-axis piston (39). One example of the kinematic couplings can be three precision shafts mounted onto three vee grooves. At the topmost Z-position, the pressure of the externally pressurized air is set at a level high enough to press the Z-axis piston (39) against the three Z-axis locking mechanisms (41A, 41B, and 41C) and freeze this topmost Z-position. For the retract mechanism for this coarse movement, there are generally two ways. One way of the coarse movement is the application of the working principle of double-acting cylinder, whereby there are two air ports on the slider body (37). One air port is to allow the upward motion; while the second air port will allow the retract movement of the Z-axis piston (39). The second way of the coarse movement is to switch between pressurized air and vacuum on the lower air port to allow the upward and downward motion respectively.

For the fine Z-positioning, the components involved include the piston decoupler (31), the Z-axis fine positioning actuators (42A, 42B, and 42C), the workpiece holder (26), and the workpiece (27). The three Z-axis fine positioning actuators (42A, 42B, and 42C) are placed 120 degree apart on the same plane mounted rigidly on the Z-axis piston (39), and the actuators (42A, 42B, and 43C) drive the workpiece (27) which is mounted on the workpiece holder (26) to the final fine Z-position. The element holding the workpiece holder (26) and the Z-axis piston (39) is the piston decoupler (31). This piston decoupler (31) is a linkage that has features to decouple the Z-position, and the two tilt moment φ and ψ of the workpiece (27) from the Z-axis piston (39), and also serves as guidance for the three actuators (42A, 42B, 42C). These three degrees of freedom allows the three Z-axis fine positioning actuators (42A, 42B, and 42C) to actuate independently and the workpiece (27) will serve as a table that has both piston movement and also tip-tilt movement. The Z-axis fine positioning actuators (42A, 42B, and 42C) can be piezo actuators with very fine resolution, or precision screw spindle driven by rotary geared motor with encoder feedback. This feature of segregating the Z-axis into coarse and fine components yields the following advantages:

(i) For the coarse movement, there are two discrete statically defined coarse movement in the Z-direction.
(ii) The conventional way for compensating for the mass effect due to gravity in the Z-axis is through the use of spring, pneumatic and hydraulic cylinder, and mass compensator. In this invention, the construction is applying high pressure of pneumatic system as a passive means to freeze the Z-position.
(iii) For the fine movement, there are three degrees of freedom to attain the statically determinate unique Z-position.
(iv) The final Z-position which is calibrated by the three Z-axis fine positioning actuators (42A, 42B, and 42C) is frozen during the operation.

In accordance with the present invention, the features of construction and operation of the decoupled XYZθ positioning apparatus are described hereinbelow with reference to the accompanying drawings and the assemblies and components introduced above.

The granite table top (1) provides a base for the positioning apparatus of the present invention, and is a slab or the like having a substantially flat and level upper surface. The inner side of the table top (1) has two flat and parallel surfaces where the Y-axis and X-axis assemblies (100, 200) are mounted on through the Y-axis guiding rails (5A and 5B). The two Y-axis actuator coils (6A and 6B) with their Y-axis actuator tracks (2A and 2B) are mounted on the outer side of the table top (1). These Y axis actuators (6A, 6B) shown in FIGS. 1 and 2 and the bearing elements are positioned at the same level as the overall centre of gantry of the moving mass of the apparatus to minimize the moment as a result of the offset. The X-axis assembly (200) is connected to the Y-axis assembly (100) through the joints (11 and 12). For this kind of H-drive configuration, one of the issues faced is the misalignment and the parallelism error from the two Y-axis guiding rails (5A and 5B) will cause the Y-axis not to perform consistently along the Y-direction movement. In the worst case, this misalignment in parallelism can cause friction to increase to an unacceptable level that leads to actuator to stall. In the preferred embodiment of the present invention, this apparatus uses two joints (11 and 12) to address this issue. On one side, Joint (11) is a ball and socket joint that will constrain the X-axis by three degree of freedoms namely, the X, Y and Z position. On the other side of the X-axis, the joint (12) is an elastic linkage that will fix three degree of freedoms, which are the Y, Z and θ position. With these six degrees of freedom constrained, the X-axis assembly is statically determinate. Also, the issue of the flatness and parallelism error arising from the two Y-axis guiding rails (5A and 5B) is addressed by the joint (12) that can comply in the X-direction and the two tilting moment θ and ψ. The construction of the X-axis assembly (200) is such that the X-axis is a low profile and compact assembly with the bearings spaced out across the width of the Y-axis push bar (13) to have the stiffness in roll and pitch. The guiding rails (16A and 16B), the X-axis actuator track (14) and the X-axis measuring scale (18) are placed strategically near the level of the centre of gravity for the moving mass for the apparatus. This will ensure that the Abbe errors for the X-axis assembly be minimized.

The construction of the θ-axis assembly (400) is such that the θ-axis involves the rotation of the Z-axis as a whole body together. The θ-axis rotary axis is perpendicular to the granite table top (1) surface, with the aerostatic bearing mechanism (29) gliding on the thin film of externally pressurized air on top of the table top (1). This θ-axis assembly (400) is driven by the θ-axis actuator (32), with the power transmitted by the flexible power transmission element (33), for example belt or the like. This θ-axis actuator (32) is rigidly anchored to the X-axis pusher plate (22), and this allows the θ-axis assembly to be free of the moving mass of the θ-axis actuator (32). The accuracy of the θ-axis derives from the θ-axis guiding elements (43A and 43B) mounted onto the X-axis pusher plate (22), which may be high precision roller bearing to guide on the θ-axis for applications that require high precision θ-axis radial run-out accuracy. For the axial run-out accuracy, it is derived by the three points of flotation from the aerostatic bearing mechanism (29) on the granite table top (1). This construction allows for several advantages:
  (i) The conventional way of using a rotary bearing element for the θ-axis will cause non-repetitive axial run-out. In accordance with the present invention, the need for this rotary bearing element is eliminated, thus resulting in the elimination of the non-repetitive axial run-out for θ-axis.
  (ii) This construction also enables the load distribution of the Z-axis assembly to be independent of the rotation of the θ-axis, as the Z-axis assembly is rotated together as a whole body. This will eliminate any issue caused from the distribution of uneven load on the Z-axis.
  (iii) The rotary axis for the θ-axis is perpendicular to the granite table top (1) surface, thereby defining the Z-position of the workpiece (27) independent of the rotational position.
  (iv) The mass of the θ-axis actuator (32) is anchored onto the X-axis assembly (200), and is not anchored on the Z-axis itself. This reduced mass leads to reduced footprint and the vertical profile of the system. This will minimize Abbe errors and improve the dynamic performance due to lighter loading on the Z-axis.

The construction of the membrane (36) and the X-axis pusher plate (22) enables the locking mechanism of the whole θ-axis and Z-axis onto the X-axis pusher plate (22) after the workpiece (27) has completed in terms of the θ-axis calibration. The membrane (36) is a thin element anchored on slider decoupler (30) which couples to the Z-axis assembly, which is capable of deforming elastically upon the effect of vacuum force. The X-axis pusher plate (22) is an element that has orifices that can channel the externally pressurized air or vacuum to the contact surface of the membrane (36). During operation, when the workpiece (27) needs the θ-axis adjustment, the X-axis pusher plate (22) is capable of allowing the externally pressurized air through the orifices. This will allow the membrane (36) to be able to float on the thin film of air with the motion smooth and frictionless. Upon the completion of the θ-axis calibration phase, the X-axis pusher plate (22) will then activate the vacuum through the orifices to suction onto the membrane (36), which will be elastically deformed and bond with the X-axis pusher plate (22) under the effect of the vacuum. At this stage, the position of the whole θ-axis and Z-axis is frozen and coupled to the X-axis.

The slider decoupler (30) is a linkage element that is anchored to both the membrane (36), which in turn is fixed to the X-axis, and also the slider body (37), which in turn is coupled rigidly to the Z-axis. The slider decoupler (30) has features that can elastically uncouple the Z, φ and ψ of the whole Z-axis assembly from the X-axis and Y-axis of the apparatus. This yields the following advantages:
  (i) The final positioning for the Z, φ and ψ for the Z-axis which carries the workpiece (27) will be independent of the Z, φ and ψ positional errors arising from the Y-axis and X-axis.
  (ii) Hence, for the Z-error of the Z-axis, which is the flatness of the motion, it is derived from the very flat and level granite table top (1) from the interaction of the aerostatic bearing mechanism (29) floating on the thin film of externally pressurized air on top of the table top (1) surface.
  (iii) Similarly for the φ and ψ, which accounts for the roll error and pitch error respectively, they will be derived from the granite table top (1) which has minimal error due to the high specifications of the granite table top (1).

A controller (not shown) is coupled to drive the all the actuators of the X-axis (21), Y-axis (6A, 6B), Z-axis (42A, 42B, 42C), and θ-axis (32) to position the workpiece holder (26) according to predetermined program or the like. The controller preferably controls the actuators in a closed loop feedback arrangement using positional signals derived from the X-axis, Y-axis, Z-axis and θ-axis position sensors (20, 10A, 10B, 24). The controller may include a memory to enable creation of a data table to record systematic errors in the overall motion of the system with respect to a precise external reference during a calibration phase. The data in the table can then be used to adjust the motion of the platform during normal use in order to minimize the systematic errors.

In accordance with the present invention, the method of using the planar positioning system is as follows:
  i. adjusting the X, Y, Z and θ-axis to the home position of the system;
  ii. moving Z, Y, Z assembly to a workpiece loading position;
  iii. moving Z assembly to suck the workpiece and holding the Z assembly at that position;
  iv. moving X and Y assembly to the measurement point of the system;
  v. moving Z assembly to the focusing point of the system;
  vi. moving θ-axis for the θ compensation in the course of the calibration phase;
  vii. moving Z assembly to the measurement system to proceed with a measurement process;
  viii. moving X and Y assembly to the unloading position; and
  ix. off-vacuuming and moving Z to the workpiece unloading position.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

The invention claimed is:
1. A planar positioning system having a flat base comprising
  a X-axis assembly having a X-axis linear actuator means arranged orthogonal to the Y-axis;
  a Y-axis assembly having a pair of Y-axis linear actuator means mounted onto the flat base forming a H-configuration;

a Z-axis assembly having an aerostatic bearing mechanism that floats on thin film of externally pressurized air on top of the flat base, wherein a movement in the Z-axis is segregated into a coarse Z-position and a fine Z-position, and wherein the coarse Z-position adjustment is actuated by means of a pneumatic system with the topmost critical movement being frozen by a kinematically determinate construction of three precision shafts sitting on three vee grooves;

a θ-axis assembly having actuator anchored from the X-axis to drive the Z-axis assembly which carries a workpiece, wherein the Z-axis assembly is rotated with the rotary axis for the θ-axis perpendicular to the flat base; and three fine positioning actuators placed 120 degrees apart, wherein the fine Z-position adjustment is carried out by a mechanism formed by the said three fine positioning actuators, said mechanism being the three degrees of freedom to attain the statically determinate final unique Z-position.

2. The planar positioning system set forth in claim 1, wherein the X-axis assembly comprises a X-axis actuator track, a X-axis actuator track bracket, X-axis guiding rails, a X-axis measuring scale, X-axis guiding blocks, a X-axis carriage, a X-axis position sensor, a X-axis actuator coil, and a X-axis pusher plate, wherein the X-axis actuator coil together with the X-axis actuator track are linear actuators that drive the X-axis carriage running on the X-axis guiding rail, with the motion guided by the X-axis guiding blocks running on the X-axis guiding rail.

3. The planar positioning system set forth in claim 2, wherein the position of the X-axis is determined by the X-axis position sensor with respect to the x-axis measuring scale.

4. The planar position system set forth in claim 3, wherein the X-axis measuring scale is mounted through the centerline of the workpiece.

5. The planar positioning system set forth in claim 2, wherein the X-axis pusher plate is mounted rigidly to the X-axis carriage.

6. The planar positioning system set forth in claim 2, wherein the X-axis linear actuator is placed in between two Y-axis linear actuators.

7. The planar positioning system set forth in claim 1, wherein the Y-axis assembly comprises
Y-axis actuator tracks and Y-axis actuator track brackets, wherein the Y-axis actuator tracks are mounted onto the Y-axis actuator track brackets, which in turn are mounted onto a granite top,
Y-axis guiding rails,
Y-axis actuator coils and Y-axis actuator coil brackets, wherein the Y-axis actuator coils are linear actuators that are positioned parallel to one another adjacent sides of the granite top, and Y-axis actuator coils are mounted onto the Y-axis actuator coil brackets,
Y-axis guiding blocks,
Y-axis carriages connected by joints,
Y-axis position sensors, and
a Y-axis push bar, wherein the Y-axis actuation from the Y-axis carriages connected by joints pushes the Y-axis push bar.

8. The planar positioning system set forth in claim 7, wherein the Y-axis motion is guided by the Y-axis guiding blocks running on the Y-axis guiding rails.

9. The planar positioning system set forth in claim 7, wherein the Y-axis guiding rails and blocks together form an aerostatic bearing system for high speed applications, a hydrostatic bearing system for heavy duty applications, and a rolling bearing system for operating in vacuum environment.

10. The planar positioning system set forth in claim 1, wherein the Z-axis assembly comprises
a slider guiding element,
an aerostatic bearing mechanism,
a piston decoupler being connected to the top end of the slider guiding element which links to the X-axis of the positioning system,
a slider body rigidly mounted on the aerostatic mechanism,
a Z-axis piston rigidly held by the Z-axis fine positioning actuators having,
a Z-axis sealing element sealed from the bottom vessel to the top vessel of the system, and
the Z-axis fine positioning actuators having moving ends being fixed to the workpiece holder which holds the workpiece, wherein the Z-axis piston is free to move in the Z direction with the guidance from the slider guiding element.

11. The planar positioning system set forth in claim 10, wherein the aerostatic bearing mechanism is an air bearing that utilizes a thin film of externally pressurized air to provide frictionless load-bearing interface between surfaces of the aerostatic bearing mechanism and a granite table top.

12. The planar positioning system set forth in claim 1, wherein the θ-axis assembly comprises a θ-axis position sensor bracket, a θ-axis position sensor, a θ-axis measuring scale, a θ-axis guiding roller bracket, a slider decoupler, a θ-axis actuator, a flexible power transmission element, a fixed roller mechanism, a roller mechanism, fixed, a preloaded roller mechanism, a membrane, θ-axis guiding elements, wherein the θ-axis actuator drives the slider decoupler via the flexible power transmission element.

13. The planar positioning system set forth in claim 12, wherein the axis actuator is a direct drive rotary motor with an iron core type of brushless motor or coreless type of brushless motor.

14. The planar positioning system set forth in claim 12, wherein the flexible power transmission element is a belt or a chain.

15. The planar positioning system set forth in claim 12, wherein the membrane is mounted rigidly to the slider decoupler, which is anchored to the Z-axis.

16. The planar positioning system set forth in claim 12, wherein the θ-axis is determined by the θ-axis position sensor.

17. The planar positioning system set forth in claim 1, wherein the Y-axis linear actuator means comprises two linear actuators arranged in parallel to each other.

18. The planar positioning system set forth in claim 1, wherein the X-axis linear actuator is placed in between two Y-axis linear actuators.

19. The planar positioning system set forth in claim 1, where the distance between the Y-axis linear actuators is more than the range of motion of the X-axis linear actuator means.

20. The planar positioning system set forth in claim 19, wherein an elastic linkage decouples flatness, roll, and the pitch errors of the Z-axis which carries a workpiece from the flatness, roll, and the pitch errors of the X-axis and Y-axis of the positioning system.

21. The planar positioning system set forth in claim 1, wherein an elastic linkage element is used to couple the X-axis to the Z-axis and θ-axis.

22. The planar positioning system set forth in claim 1, further comprises a positional sensing means for closed loop feedback control for all the X-axis, Y-axis, Z-axis and θ-axis.

23. The planar positioning system of claim 1, further comprising a ball and a socket joint and an elastic linkage joint to couple the Y-axis assembly with the X-axis assembly to form a H-configuration.

24. A method of using the planar positioning system of claim 1, comprising the steps of
- adjusting the X, Y, Z and θ-axis to a home position of the system;
- moving the Z, Y, Z assembly to a workpiece loading position;
- moving the Z assembly to suck the workpiece and holding the Z assembly at that position;
- moving the X and Y assembly to a measurement point of the system;
- moving the Z assembly to a focusing point of the system;
- moving the θ axis for a θ compensation in the course of a calibration phase;
- moving the Z assembly to a measurement system to proceed with a measurement process;
- moving the X and Y assembly to a workpiece unloading position; and
- off-vacuuming and moving the Z assembly to the workpiece unloading position.

\* \* \* \* \*